(12) United States Patent
Fenouillet-Beranger et al.

(10) Patent No.: US 9,793,162 B2
(45) Date of Patent: Oct. 17, 2017

(54) METHOD FOR PRODUCING INTERCONNECTIONS FOR 3D INTEGRATED CIRCUIT

(71) Applicant: Commissariat a L'Energie Atomique et aux Energies Alternatives, Paris (FR)

(72) Inventors: Claire Fenouillet-Beranger, Voiron (FR); Philippe Coronel, Barraux (FR)

(73) Assignee: Commissariat à l'énergie atomique et aux énergies alternatives, Paris (FR)

(*) Notice: Subject to any disclaimer, the term of this patent is extended or adjusted under 35 U.S.C. 154(b) by 64 days.

(21) Appl. No.: 14/887,831

(22) Filed: Oct. 20, 2015

(65) Prior Publication Data
US 2016/0111330 A1 Apr. 21, 2016

(30) Foreign Application Priority Data
Oct. 21, 2014 (FR) ...................... 14 60102

(51) Int. Cl.
| | |
|---|---|
| H01L 21/768 | (2006.01) |
| H01L 21/3065 | (2006.01) |
| H01L 21/324 | (2006.01) |
| H01L 27/06 | (2006.01) |
| H01L 21/822 | (2006.01) |

(Continued)

(52) U.S. Cl.
CPC .... *H01L 21/76897* (2013.01); *H01L 21/3065* (2013.01); *H01L 21/324* (2013.01); *H01L 21/7688* (2013.01); *H01L 21/76801* (2013.01); *H01L 21/76816* (2013.01); *H01L 21/76879* (2013.01); *H01L 21/8221* (2013.01); *H01L 27/0688* (2013.01); *H01L 21/28518* (2013.01);

(Continued)

(58) Field of Classification Search
CPC ......... H01L 21/02203; H01L 21/76808; H01L 21/76811; H01L 21/76885; H01L 2221/1026; H01L 2221/1063; H01L 21/76879; H01L 21/7688; H01L 21/76897
See application file for complete search history.

(56) References Cited

U.S. PATENT DOCUMENTS

| | | |
|---|---|---|
| 5,461,003 A | 10/1995 | Havemann et al. |
| 7,804,134 B2 | 9/2010 | Coronel et al. |

(Continued)

FOREIGN PATENT DOCUMENTS

| | | |
|---|---|---|
| EP | 2 073 619 B1 | 8/2011 |
| FR | 3 002 688 A1 | 8/2014 |

OTHER PUBLICATIONS

French Preliminary Search Report issued Jul. 17, 2015 in French Application 14 60102, filed on Oct. 21, 2014 (with English Translation of Categories of Cited Documents).

(Continued)

*Primary Examiner* — Fernando L Toledo
*Assistant Examiner* — Adam S Bowen
(74) *Attorney, Agent, or Firm* — Oblon, McClelland, Maier & Neustadt, L.L.P.

(57) ABSTRACT

Method for producing one or more connection elements for integrated circuit including the formation of sacrificial elements passing through a porous layer formed between two superimposed levels of transistors, then the removal of the sacrificial elements through the porous layer and their replacement by a conductor material before or after having produced a higher level transistor.

19 Claims, 16 Drawing Sheets

(51) Int. Cl.
H01L 21/285 (2006.01)
H01L 21/8234 (2006.01)

(52) U.S. Cl.
CPC .. H01L 21/7682 (2013.01); H01L 21/823475 (2013.01)

(56) References Cited

U.S. PATENT DOCUMENTS

| | | | |
|---|---|---|---|
| 2004/0266169 A1* | 12/2004 | Sakata | H01L 21/76807 438/622 |
| 2005/0110145 A1 | 5/2005 | Elers | |
| 2007/0181957 A1 | 8/2007 | Kim et al. | |
| 2009/0294984 A1 | 12/2009 | Zhu | |
| 2010/0013049 A1 | 1/2010 | Tanaka et al. | |
| 2013/0330471 A1 | 12/2013 | Dellea et al. | |
| 2014/0147583 A1 | 5/2014 | Dellea et al. | |
| 2014/0158334 A1 | 6/2014 | Dellea et al. | |
| 2014/0356528 A1 | 12/2014 | Dellea et al. | |
| 2014/0374930 A1 | 12/2014 | Dellea et al. | |
| 2015/0010693 A1 | 1/2015 | Dellea et al. | |
| 2015/0044809 A1 | 2/2015 | Dellea et al. | |
| 2015/0084480 A1 | 3/2015 | Savelli et al. | |
| 2015/0115769 A1 | 4/2015 | Savelli et al. | |
| 2015/0217328 A1 | 8/2015 | Dellea et al. | |

OTHER PUBLICATIONS

Peiwen Zheng et al. "A Surprise from 1954: Siloxane Equilibration is a Simple, Robust, and Obvious Polymer Self-Healing Mechanism", Journal of the American Chemical Society, vol. 134, 2012, 4 pages.
Jean-Charles Eloi et al. "Metallopolymers with Emerging Applications", Materials Today, vol. 11, No. 4, Apr. 2008, 9 pages.
C.P.S. Hsu et al. "Cleaning Options for Copper/Ultralow-k Structures", Semiconductor International, Dec. 2005, 4 pages.
Katherine Bourzac "First Self-Healing Coatings: A Paint Additive will Protect Cars, Bridges, and Ships from Corrosion", Business News, Dec. 12, 2008, 2 pages.
Dong Yang Wu et al. "Self-Healing Polymeric Materials: A Review of Recent Developments", Progress in Polymer Science, vol. 33, 2008, 44 pages.
H. G. Craighead et al. "Metal Deposition by Electron Beam Exposure of an Organometallic Film", Applied Physics Letters, vol. 48, 1986, 4 pages.

* cited by examiner

METHOD FOR PRODUCING INTERCONNECTIONS FOR 3D INTEGRATED CIRCUIT

TECHNICAL FIELD

The present application relates to the field of integrated circuits equipped with components spread out on several levels, in particular superimposed transistors.

Such devices are generally qualified as 3-dimensional or "3D" integrated circuits.

PRIOR ART

Generally speaking, in the field of integrated circuits, it is continually sought to increase the density of transistors.

To do this, a solution consists in arranging the transistors on several levels of superimposed semi-conductor layers. Such circuits thus generally comprise at least two superimposed semi-conductor layers and separated from each other by an insulator layer.

Conductor elements passing through this insulator layer may be provided to connect together the different levels of transistors.

The production of upper level transistors may involve the implementation of one or more steps of heat treatment at high temperature, especially when an activation of dopants is carried out.

A high temperature heat treatment may lead to a degradation of the conductor material based on which the inter-level connection elements are formed.

The problem is thus posed of finding a novel method for producing a 3D integrated circuit which does not comprise the aforementioned drawbacks.

DESCRIPTION OF THE INVENTION

An embodiment of the present invention thus provides a method for producing one or more connection elements for integrated circuit including the steps consisting in:

producing one or more sacrificial elements passing through at least one porous layer, the porous layer surmounting a first transistor produced at least partially in a first semi-conductor layer, the production of the sacrificial elements including the formation of one or more first openings passing through the porous layer then the filling of the first openings by means of a sacrificial material, forming a support on the porous layer, this support including a second semi-conductor layer, at least one second transistor being produced at least partially in the second semi-conductor layer, the method further including, after producing the sacrificial elements, the steps consisting in:

removing the sacrificial element(s) of the first openings, using an etching agent of the sacrificial material, the etching agent being capable of being introduced through the porous layer(s), filling the first openings by means of a conductor material so as to form connection elements, the filling being carried out through one or more second openings made in the support and emerging respectively on at least one of the first openings.

The first transistor may belong to a first level of transistors.

Thus, according to this method, the step of formation of the inter-level connection elements is deferred in order to preserve the conductor material.

Advantageously, the removal of the sacrificial element(s) is carried out before the step of formation of the support. This can make it easier to remove these sacrificial elements. This can also make it possible to avoid subjecting these elements to a too considerable thermal budget.

After the formation of the support on the porous layer and prior to the filling of the first openings by the conductor material, at least one step of heat treatment at high temperature may be provided.

In this case, the conductor material of the inter-level connection elements is preserved from this step of heat treatment capable of degrading it. This heat treatment may be for example a step of laser annealing carried out to produce an activation of dopants.

The conductor material may in particular be based on copper, or tungsten, or cobalt, these materials being sensitive to considerable thermal budgets.

According to a possibility of implementation of the method, the sacrificial material may be a material selected in order to be able to be easily removed such as a polymer material.

The etching agent may be in the form of gas or plasma capable of reacting with the polymer material. Such an etching agent can penetrate through the porous layer while being able to be removed easily. An etching agent in the form of gas is capable of passing to and fro via the same path through the porous layer but not in the same chemical form.

According to a possibility of implementation of the method, after formation of the first openings and prior to the filling of the first openings by means of a sacrificial material, the steps may be carried out consisting in:

depositing an encapsulation layer lining the bottom and the side walls of the first openings, removing the encapsulation layer at the bottom of the first openings, the encapsulation layer being conserved at the level of the side walls of the first openings.

This encapsulation layer may serve as protective layer of the material of the porous layer. This encapsulation layer may also play the role of mechanical support.

According to a possibility of implementation of the method, in which the first openings are formed by etching through the holes of a hard mask, this hard mask may be at least partially conserved after etching. The hard mask may then also serve as protection of the material of the porous layer during the method.

According to a particular embodiment, it is possible to provide to replace the porous layer. Thus, after filling by means of the conductor material, the method may include the steps consisting in:

making at least one access well in the support and revealing the porous layer, removing the material of the porous layer by etching through the access well, replacing the material of the porous layer by a dielectric material.

The replacement dielectric material may be advantageously a low-k type material.

Thus, connection elements are obtained passing through a dielectric material which has not undergone degradation or has undergone little degradation brought about by certain steps of the method.

According to an implementation possibility for which at least one of the first openings reveals a given region of the first transistor, the method may further include, after removal of the sacrificial material and prior to the filling by means of a conductor material: formation of a zone of alloy of metal and semi-conductor on the given region.

Thus it is possible to defer the silicidation of regions of the first transistor after having formed the second upper level transistor and potentially at the same time as the silicidation of the upper level transistor.

According to another aspect, the invention provides for a 3D integrated circuit formed by means of a method such as defined previously.

An embodiment of the present invention also provides for an integrated circuit including:
- a first transistor produced at least partially in a first semi-conductor layer,
- a support arranged on the first transistor, this support including a second semi-conductor layer, a second transistor being produced at least partially in the second semi-conductor layer,
- a porous layer arranged between the first transistor and the second transistor, the porous layer being passed through by one or more elements based on a sacrificial material such as a polymer material or a conductor material.

BRIEF DESCRIPTION OF THE DRAWINGS

The present invention will be better understood on reading the description of embodiment examples given for purely illustrative purposes and in no way limiting, while referring to the appended drawings in which.

Figure 1A:
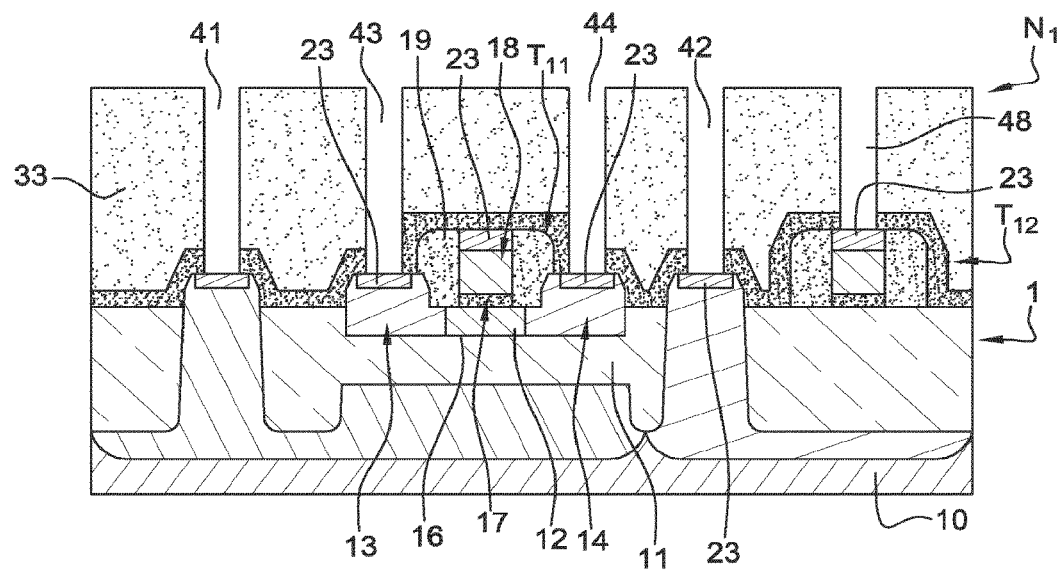
FIGS. 1A-1L serve to illustrate an example of method for producing connection elements between different levels of transistors of a 3D integrated circuit in which sacrificial elements are formed in at least one layer of porous material, these sacrificial elements then being replaced by a conductor material.

Identical, similar or equivalent parts of the different figures bear the same numerical references so as to make it easier to go from one figure to the next.

The different parts in the figures are not necessarily shown according to a uniform scale in order to make the figures more legible.

DETAILED DESCRIPTION OF PARTICULAR EMBODIMENTS

An example of method for producing connection elements for a 3-dimensional or "3D" integrated circuit device will now be given in conjunction with FIGS. 1A-1L.

The device may be produced from a substrate 1 of semi-conductor on insulator type, for example of SOI type (SOI for "Silicon on Insulator"), including a semi-conductor support layer 10, an insulator layer 11 lying on the support layer 10, and a superficial semi-conductor layer 12 in which channels of transistors $T_{11}$ and transistor $T_{12}$ are provided. The transistors $T_{11}$ and $T_{12}$ may be MOS transistors (MOS for Metal Oxide Semi-conductor) produced for example according to a technology of FDSOI (Fully Depleted Silicon On Insulator) type. In this example, the transistors $T_{11}$ and transistor $T_{12}$ belong to a first level $N_1$ of a stack of electronic components spread out over 3 dimensions.

The transistors $T_{11}$, $T_{12}$ formed on the substrate 1 comprise a source region 13, a drain region 14, as well as a channel region 16, connecting the source region 13 and the drain region 14, a gate dielectric 17 and a gate 18 on the zone 17 of gate dielectric. Insulator spacers 19 are also produced on either side of the gate 18.

In this embodiment example, regions of transistors $T_{11}$, $T_{12}$, in particular source, drain and gate regions, are surmounted respectively by zones 23 of alloy of metal and semi-conductor commonly called silicidation zones to form contacts.

The transistors $T_{11}$, $T_{12}$ are covered with at least one layer 33 of dielectric material, for example at least one layer of $SiO_2$, which can then be planarized for example by chemical mechanical planarization (CMP).

The first holes 41, 42, 43, 44, 48 are then produced in the dielectric layer 33 which are intended to receive pads making it possible to produce contact points on the transistors $T_{11}$, $T_{12}$ (FIG. 1A).

Figure 1B:
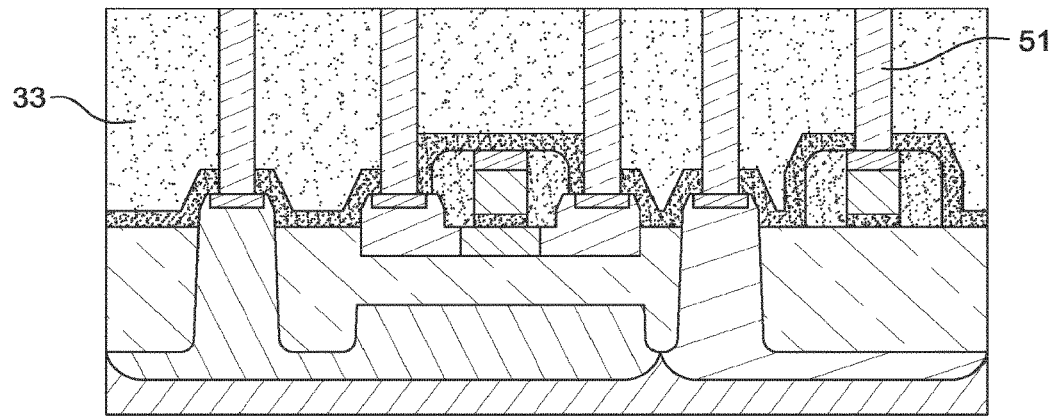

A filling of the first holes 41, 42, 43, 44, 48 is then carried out by means of a sacrificial material 51, intended to be removed later (FIG. 1B). This sacrificial material 51 may be a polymer material, for example such as polyamide or PMMA (polymethyl methacrylate) or a fluorinated polymer or a synthetic resin.

Figure 1C:
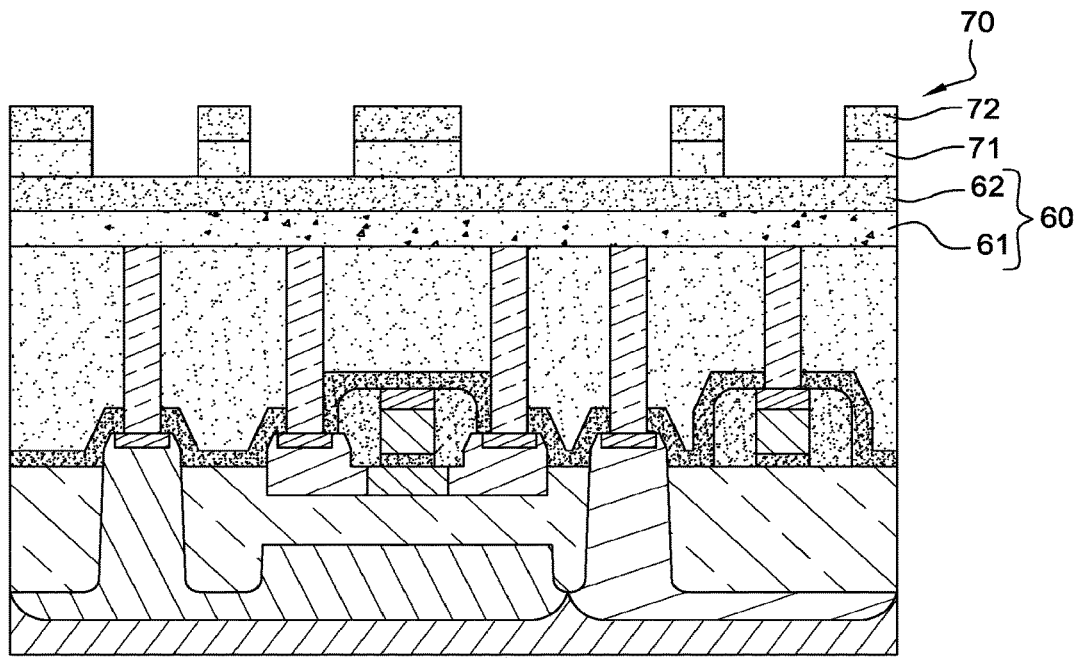

Then, at least one porous layer 60 is formed on the dielectric layer 33 (FIG. 1C).

The porous layer 60 may be formed of a stack including a layer 61 based on a first porous material such as for example SiCN of thickness for example of the order of 20 nm and a layer 62 based on a second porous material, in particular a material of "ultra low-k" type such as for example SiOC of thickness for example of the order of 140 nm.

Then, one or more second holes 63, 64, 65, 66 are produced in this porous layer 60. The second holes 63, 64, 65, 66 communicate respectively with one or more of the first holes 41, 42, 43, 44, 48 filled with sacrificial material 51.

Figure 1D:
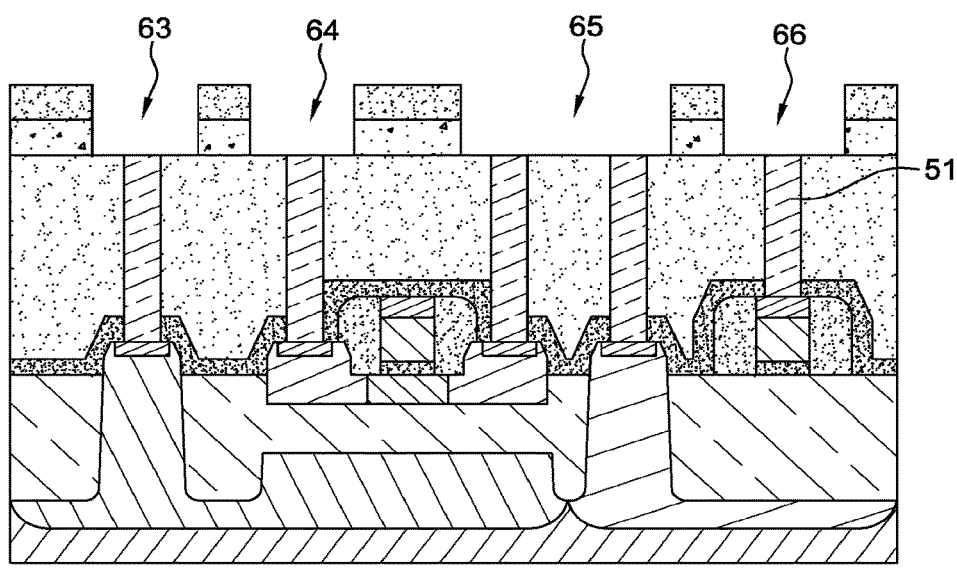

The second holes 63, 64, 65, 66 may be produced by etching of the porous layer 60 through a hard mask 70. This hard mask 70 may be formed of a stack including a layer 71 for example based on TEOS (tetraethyl orthosilicate) surmounted by another layer 72 for example based on TiN of the order of 15 nm (FIG. 1D).

Figure 1E:
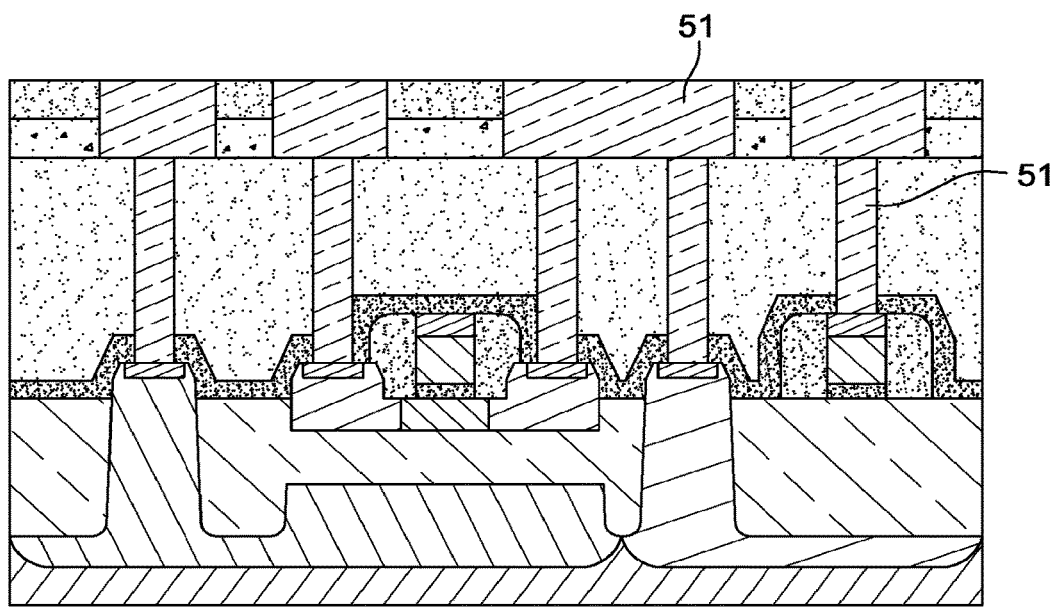

The second holes 63, 64, 65, 66 are then filled with a sacrificial material, advantageously the same sacrificial material 51 as that filling the first holes 41, 42, 43, 44, 48 (FIG. 1E). A step of planarization (CMP) may be carried out after filling in order to remove excess sacrificial material 51.

In a variant of the steps described in conjunction with FIGS. 1A to 1E, it is possible to carry out a method according to an approach of type known as "Dual Damascene" for which the first holes 41, 42, 43, 44, 48, the second holes 63, 64, 65, 66 are filled at one time.

It is then possible to reiterate one or more times a sequencing of steps such as described previously and consisting in forming a porous layer 60 and a hard mask 70 on this porous layer 60, then forming holes in the porous layer 60 and filling these holes by means of a sacrificial material 51.

Figure 1F:
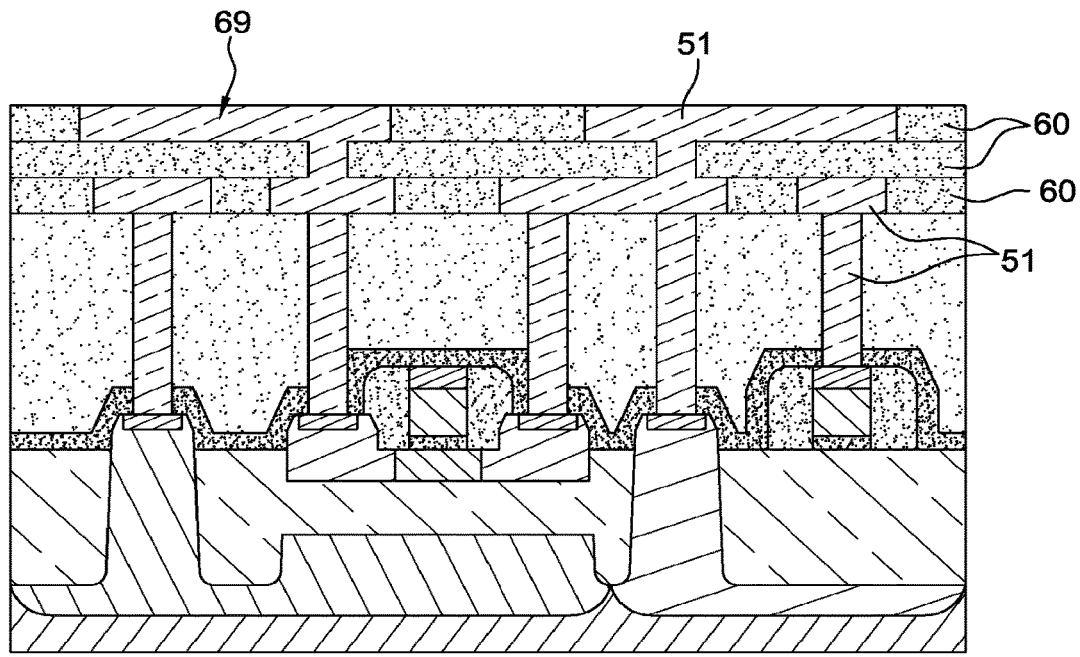

It is thus possible to obtain a structure such as illustrated in FIG. 1F comprising elements 69 based on sacrificial material 51 arranged in openings passing through at least one porous layer 60 formed on the transistors $T_{11}$, $T_{12}$.

An additional sacrificial porous layer 60' may then be formed, so as to cover the elements 69 based on sacrificial material 51 and the other porous layers 60.

Figure 1G:
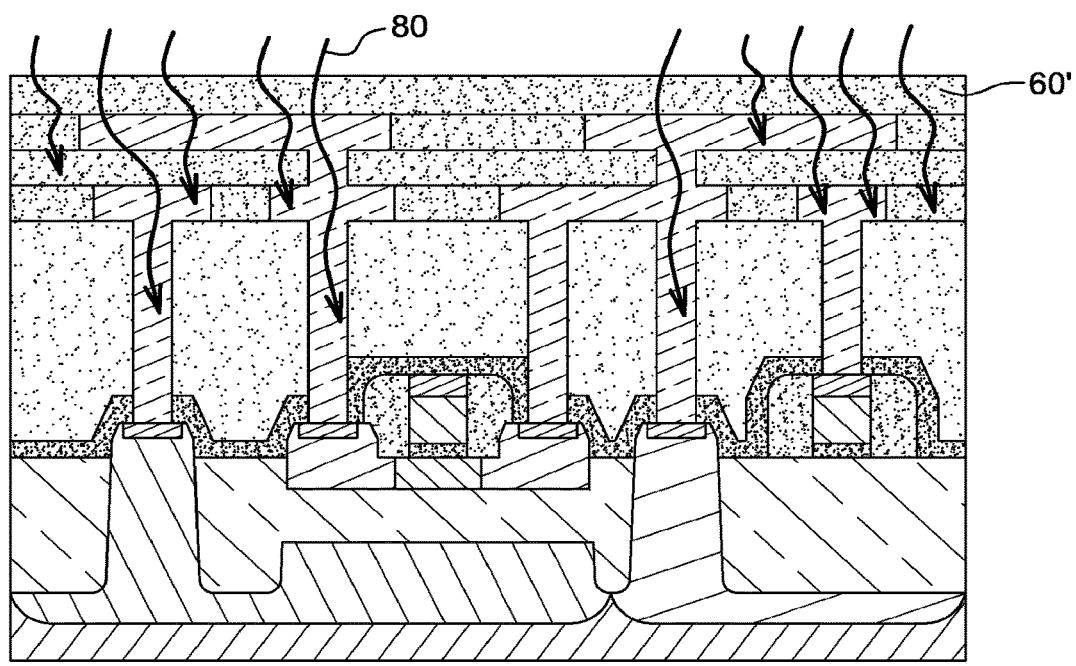

A removal is then carried out of the sacrificial elements 69 using an etching agent 80 capable of being introduced through the porous layer(s) 60', 60 (FIG. 1G). This etching agent 80 is preferably gaseous or in the form of plasma in order to facilitate its elimination once the etching is carried out. In the case of a sacrificial material 51 based on polymer material, the etching agent 80 is for example oxygen or a plasma based on oxygen or supercritical $CO_2$.

Figure 1H:
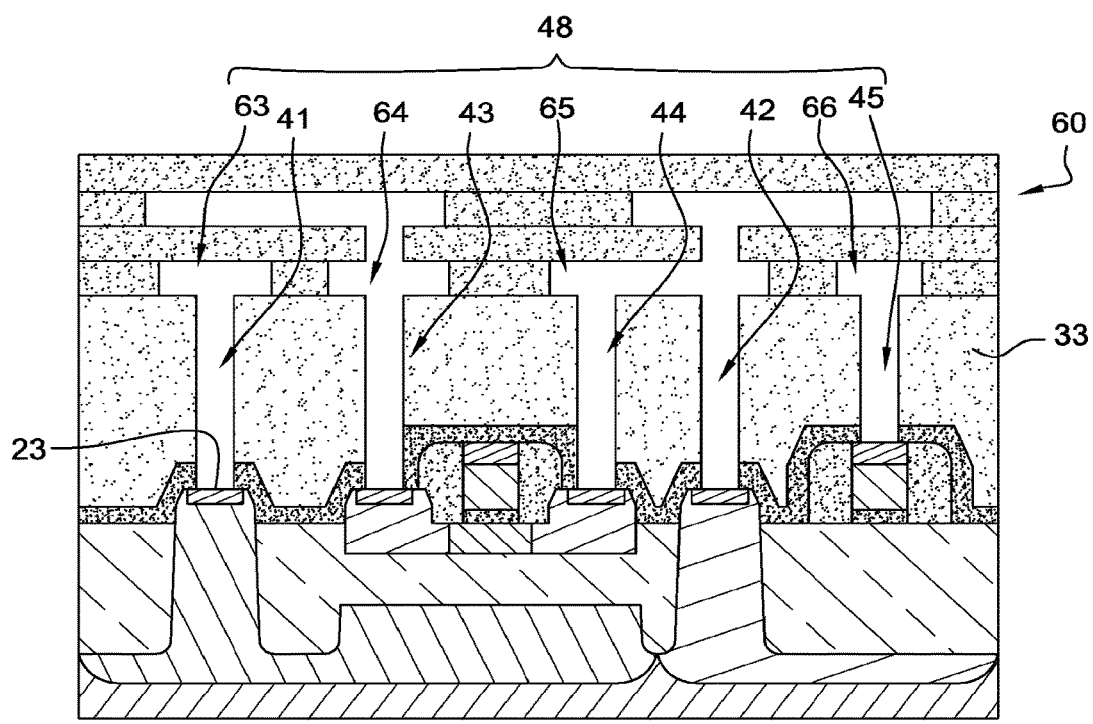

The set of first holes 41, 42, 43, 44, 48 and second holes 63, 64, 65, 66 emptied of sacrificial material form openings 68 through the porous layer(s) 60, 60' and extending in this example up to the contact zones 23 of the transistors T11, T12 (FIG. 1H).

The stack of porous layers 60, 60' may be then covered with another layer, for example a layer 91 of dielectric material such as $SiO_2$, intended to serve as bonding layer to produce an assembly with a support.

Figure 1I:
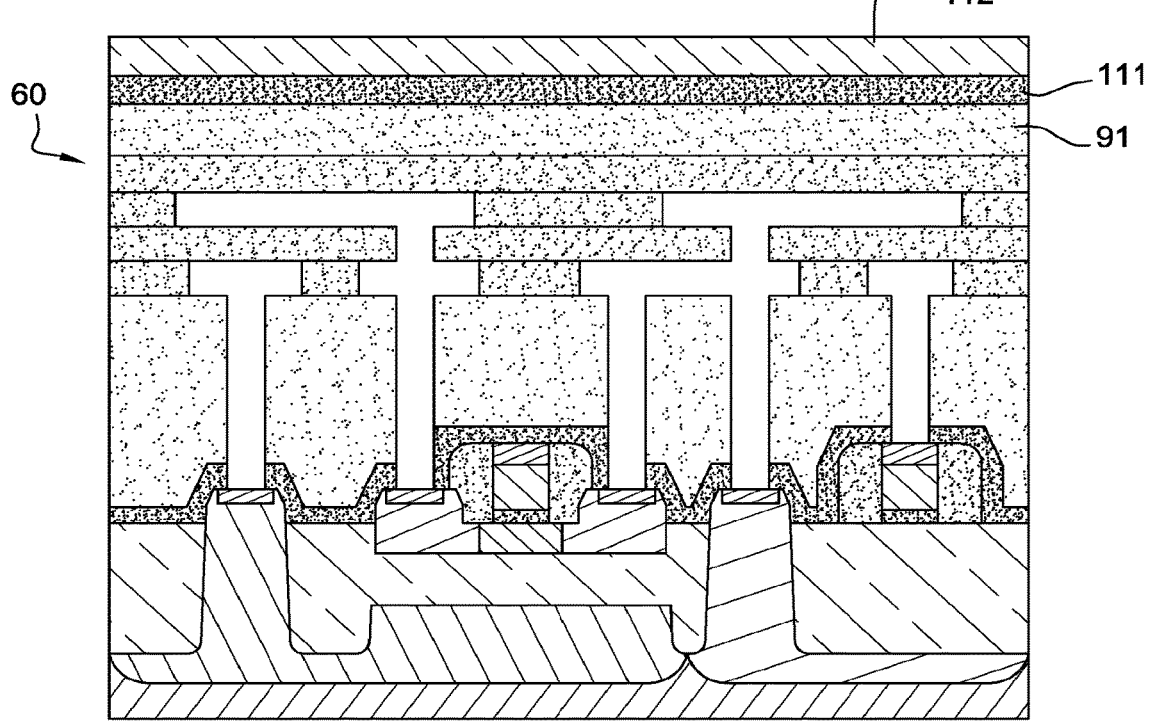

Onto this layer 91 of dielectric material is then transferred, for example by molecular bonding, a support including a semi-conductor layer 112 (FIG. 1I). This support 100 may be equipped with an insulator layer 111, for example based on $SiO_2$, which is placed in contact with the dielectric layer 91 to carry out the bonding. According to a variant (not represented), it is possible to transfer a semi-conductor layer 112 directly onto the dielectric layer 91.

Then, at least one transistor $T_{21}$ of a second level $N_2$ of the 3D stack is formed from the semi-conductor layer 112. The transistor $T_{21}$ produced has a channel region which extends into the semi-conductor layer 112, source and drain regions which may be at least partially formed in the semi-conductor layer 112, as well as a gate dielectric and a gate formed on the channel region.

Figure 1J:
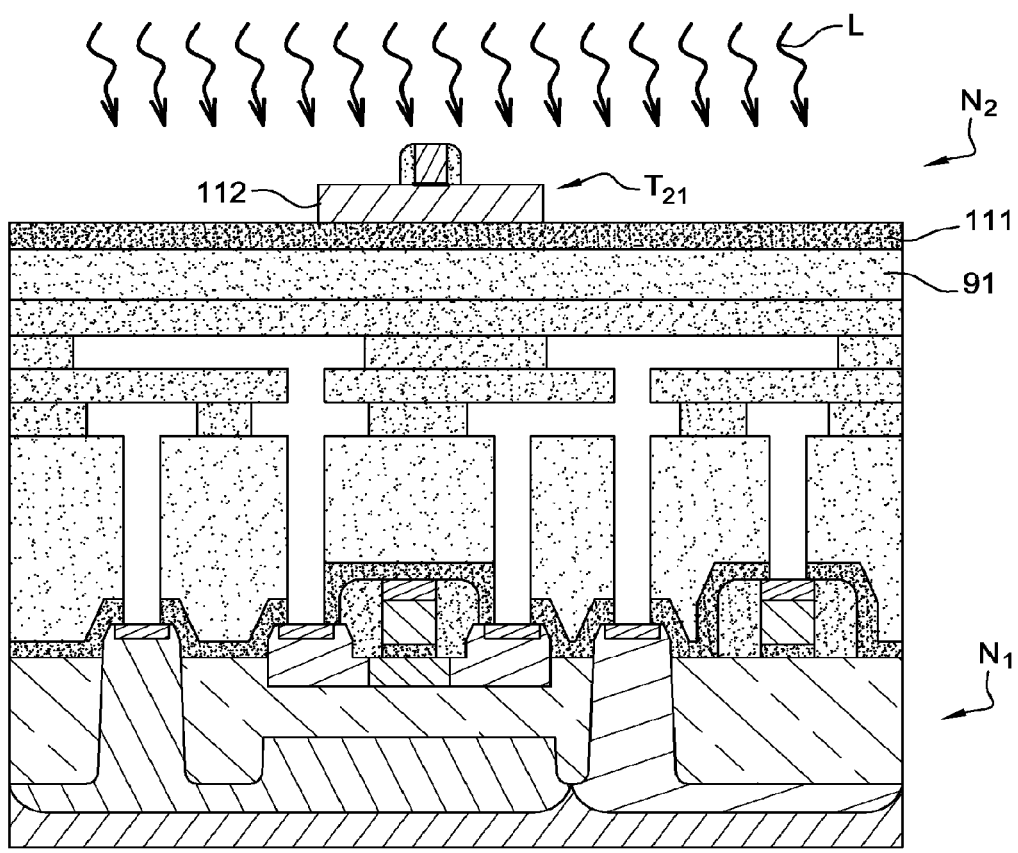

The formation of the transistor $T_{21}$ may include a step of activation of dopants by means of at least one thermal annealing, in particular at high temperature. High temperature is here taken to mean a temperature above 500° C. This thermal annealing may be carried out by means of a laser L for example at a localised temperature of the order of 1200° C., which makes it possible to implement a very localised annealing (FIG. 1J).

During such a step, the porous layers 60, 60' may advantageously play the role of thermal insulator and thereby limit the diffusion of heat towards the transistors $T_{11}$, $T_{12}$ of lower level $N_1$.

Then, a passivation insulator layer 121 is formed, for example based on $SiO_2$ on the transistor $T_{21}$ of the second level $N_2$.

Openings 133, 134, 135, 136 are then made in this insulator layer 121.

Figure 1K:
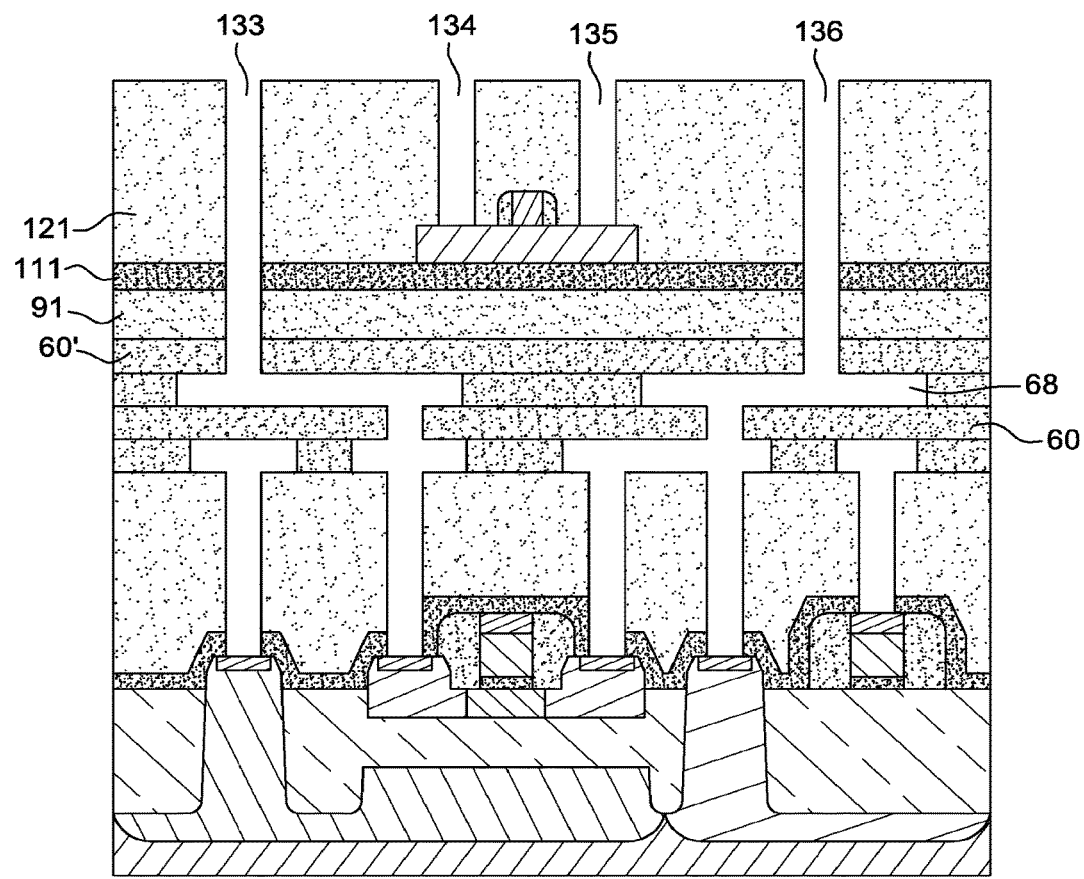

Certain openings 133, 136 pass through the insulator layer 111 of the support 100 and emerge on the openings 68 made in the stack of porous layers 60, whereas other openings 134, 135, may emerge on regions of the transistor $T_{21}$, for example respectively on gate region, source region and drain region (FIG. 1K). The openings 133, 134, 135, 136 may be produced at the same time or in a variant successively by groups. It is possible for example to produce the openings 133, 136 passing through the insulator layer 111 of the support 100 and emerging on the openings 68 then producing the other openings 134, 135, emerging on regions of the transistor $T_{21}$.

Figure 1L:
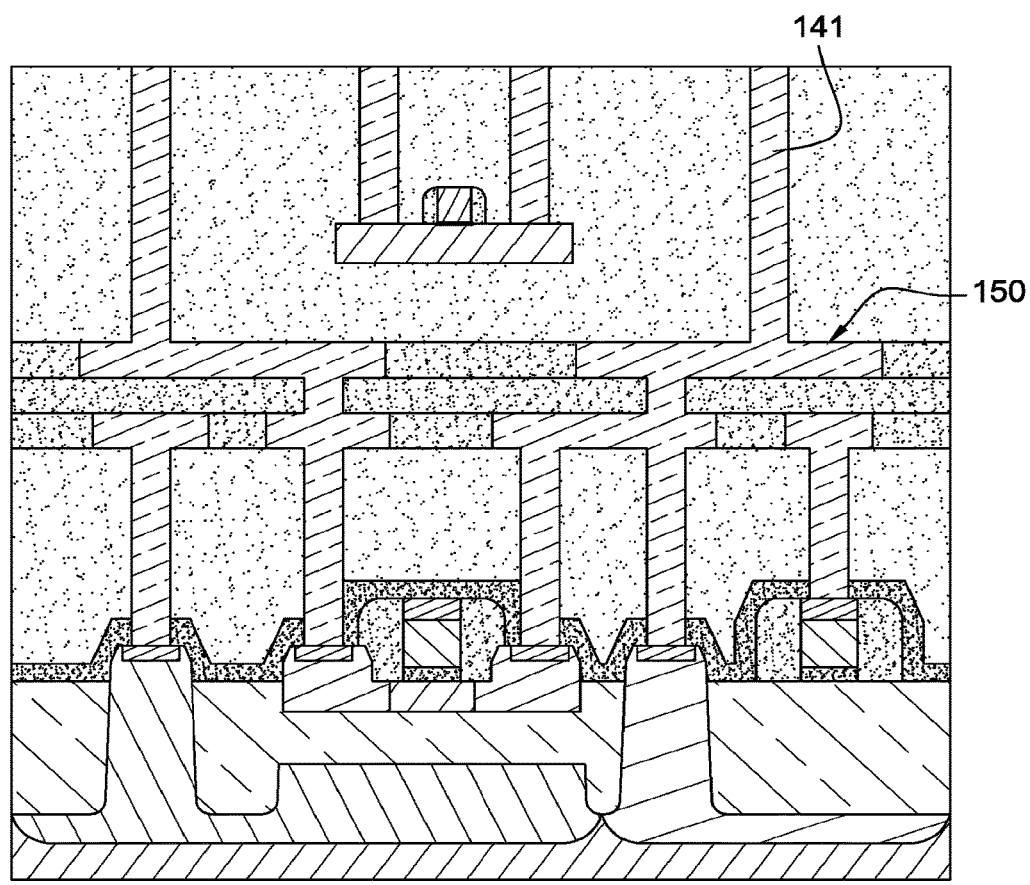

The openings 133, 134, 135, 136 are then filled with conductor material 141 (FIG. 1L). This conductor material 141 may be a metal such as for example copper. In a variant, the conductor material 141 may be formed by an organometallic material such as described for example in the document: "Metallopolymers with emerging applications", of Eloi et al., Materials Today, April 2008, or by an organometallic material capable of being transformed into metal for example such as that described in the document "Metal deposition by electron beam exposure of an organometallic film", of Craighead et al., American Institute of Physics, 1986. According to another variant, the filling of the openings by a metal conductor material may be carried out by means of a method such as described for example in the document FR 3002688.

The sizes of the openings 133 and 136 are determined by those skilled in the art in order to be able to be filled, potentially integrally. It is also possible to deposit, prior to filling by the material 141 in the openings, a diffusion barrier based for example on Ta/TaN.

Connection elements 150 are thereby produced between superimposed levels $N_1$ and $N_2$ of a 3D circuit without having subjected these connection elements 150 to a too high thermal budget and capable of deteriorating the interconnection structure and in particular the conductor material 141 based on which this structure is formed.

Figure 2:
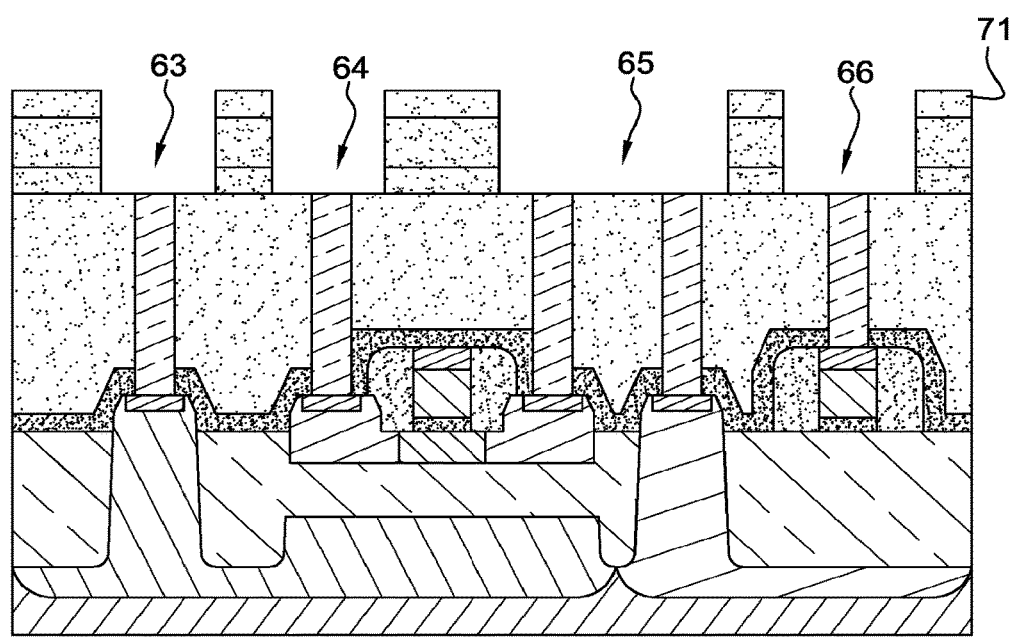
FIG. 2 illustrates an embodiment variant providing for a protective layer of the porous material.

A variant of the example of method which has been described provides, after the step described in conjunction with FIG. 1C and consisting in making the holes 63, 64, 65, 66 in the porous layer 60, for conserving at least one layer 71 forming the hard mask 70 (FIG. 2). This layer 71 may be for example based on low temperature silicon oxide or silicon nitride, or for example based on a low-k material of BN/SiCBN type resistant to considerable thermal budgets. This hard mask layer 71 then serves especially as a layer for protecting the porous material from subsequent etching step(s). At the step described previously in conjunction with FIG. 1L where the connection elements 150 are produced, this protective layer 71 may be conserved.

Figure 3A:
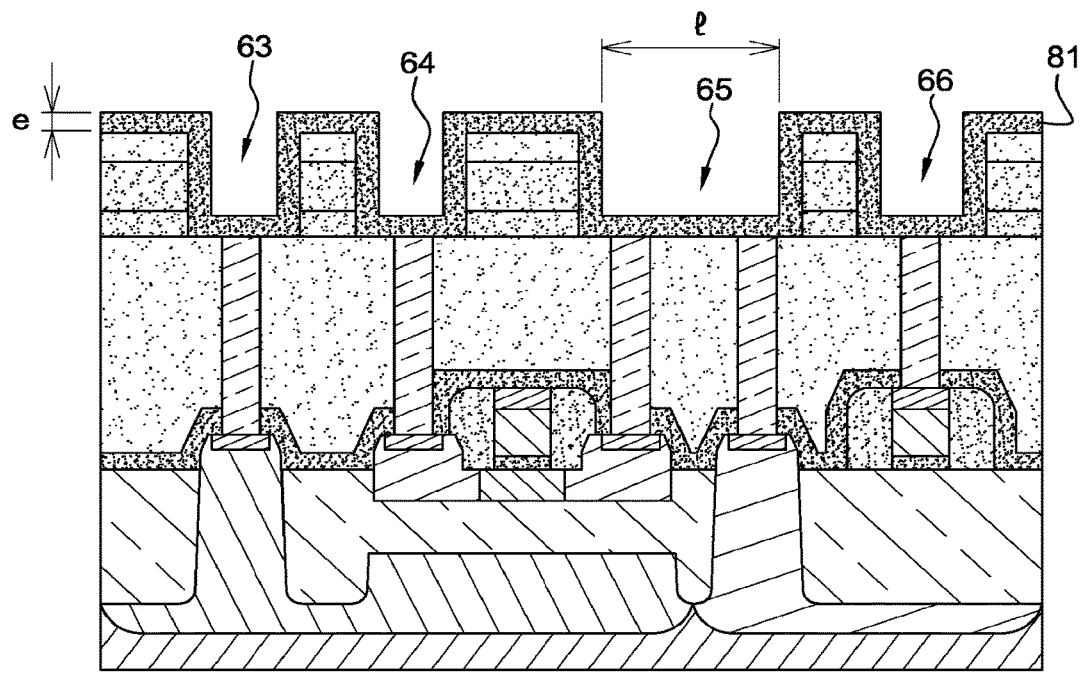
FIGS. 3A-3C illustrate an embodiment variant providing for an encapsulation layer of the porous material.

Another variant, which may be combined with the preceding variant, provides for, after having made the holes 63, 64, 65, 66 in the porous layer 60, forming an encapsulation layer 81 lining the bottom and the side walls of the holes 63, 64, 65, 66 (FIG. 3A). The thickness of this layer 81 may be provided as a function of the width I of the holes 63, 64, 65, 66, for example of the order of ⅓ the width I of the holes. This encapsulation layer 81 may be for example based on silicon nitride and of thickness for example of the order of 10 nm.

Figure 3B:
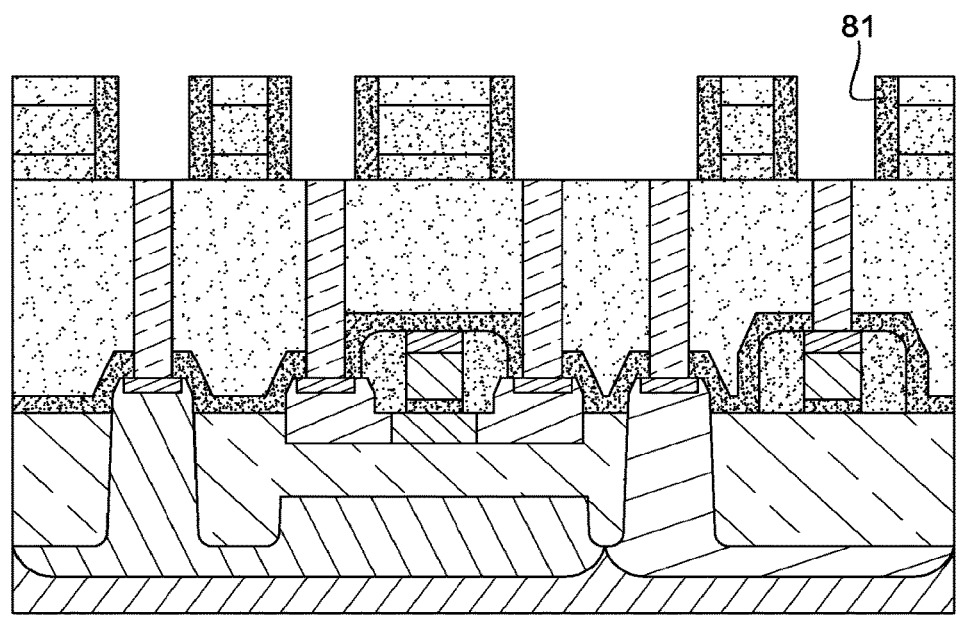

Then a removal of the encapsulation layer 81 at the bottom of the holes 63, 64, 65, 66 is carried out, the encapsulation layer being conserved at the level of the side walls of the holes 63, 64, 65, 66 (FIG. 3B). This removal may be carried out for example by means of a plasma etching method. The encapsulation layer 81 then serves as a lateral protection of the porous material. The encapsulation layer 81 is also intended to serve to produce a mechanical resistance of the layers during steps of heat treatment during the production of an upper stage.

Figure 3C:
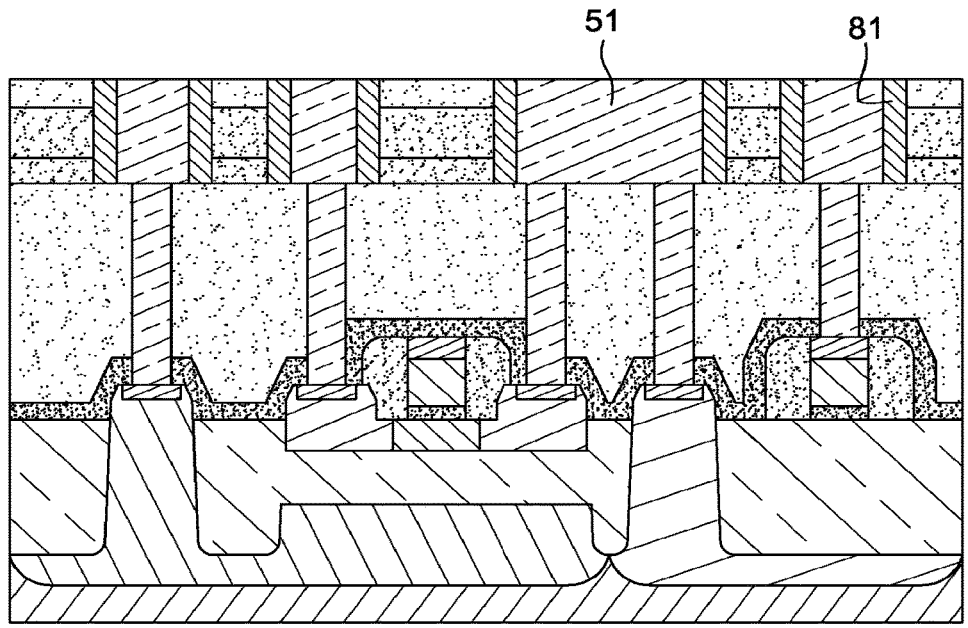

The holes 63, 64, 65, 66 are then filled by the sacrificial material 51 (FIG. 3C).

Figure 4:
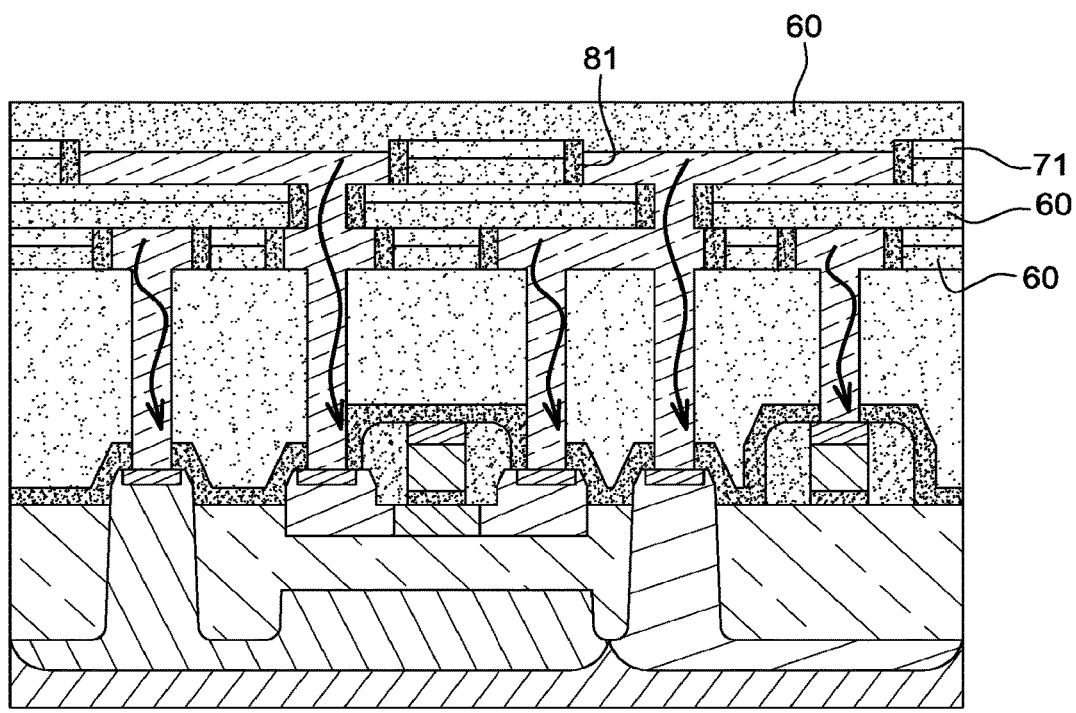
FIG. 4 illustrates an embodiment variant of the method providing for a structure for supporting the porous material.

It is then possible to reiterate the sequence of steps described previously in conjunction with FIGS. 2, 3A, 3B, 3C, in order to form several levels of porous layers 60 with at each level a protective layer 71 and an encapsulation layer 81 (FIG. 4).

The set of protective layer(s) 71 and encapsulation layer(s) 81 can also make it possible to assure the cohesion of the stack of porous layers 60 especially during steps of heat treatment and/or during the removal of the sacrificial material 51 and/or during a potential step of replacement of the porous material.

According to an embodiment variant (FIGS. 5A-5C), once the connection elements 150 are produced, it is provided to replace the porous layer(s) 60 by another dielectric material.

Figure 5A:
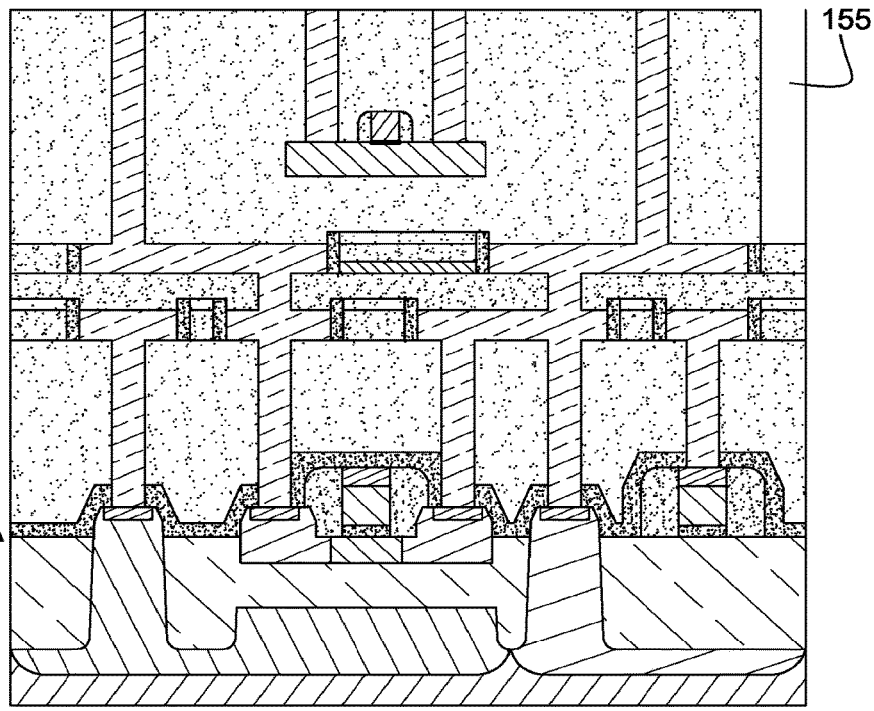
FIGS. 5A-5C illustrate an embodiment variant of the method providing for a replacement of the porous material by a dielectric material.

To do so, at least one access well 155 is produced passing through the insulator layer 121, and which reveals the porous layer 60 or the stack of porous layers 60 (FIG. 5A).

Figure 5B:
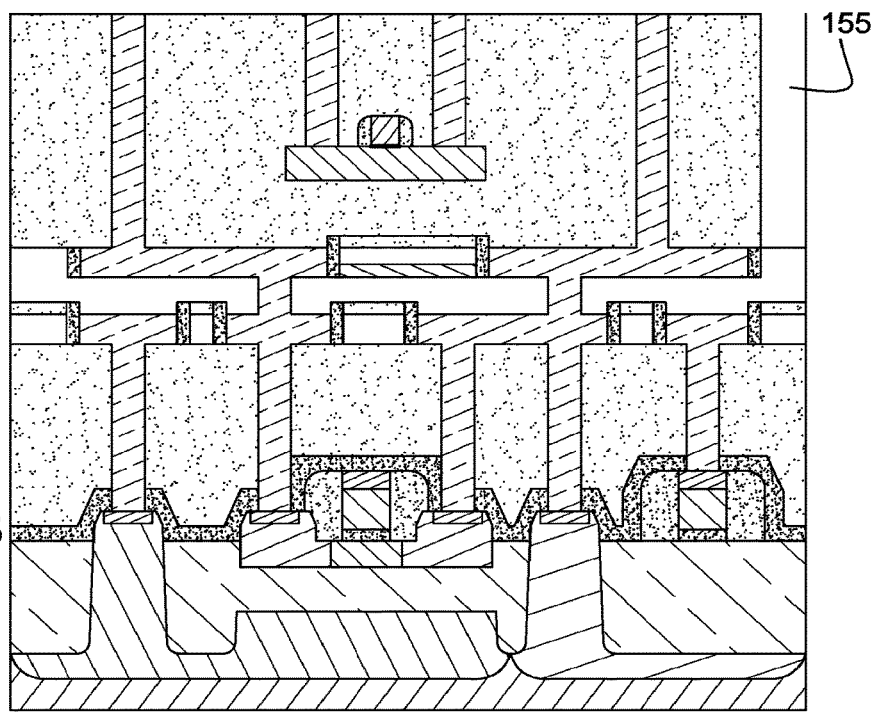

Then the porous material(s) are removed by etching through the access well 155 (FIG. 5B). This etching may be carried out for example by means of a gaseous mixture comprising a fluorinated gas such as for example $CHF_3$ to remove a material based on SiCN or $C_4F_8$ to remove a porous material based on SiOC, the fluorinated gas being mixed with a neutral gas such as $N_2$ or Ar.

Figure 5C:
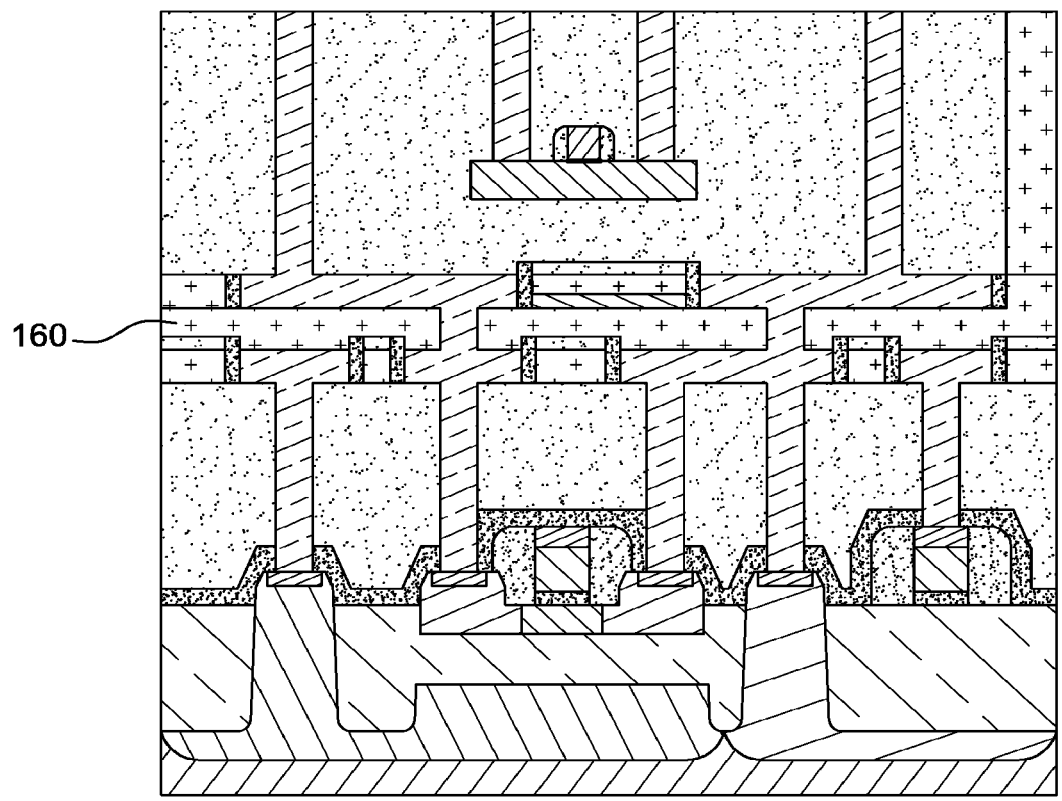

Then, the porous material(s) are replaced by a dielectric material 160 which may itself be porous. The replacement dielectric material 160 may be for example $SiO_2$ or for example of "low-k" type such as SiCBN, or SiOCH, or BN or "ultra low-k" type such as SiOC (FIG. 5C).

This variant makes it possible to have in the end a dielectric material 160 between the levels $N_1$ and $N_2$ of the integrated circuit which has not undergone transformation and has not been degraded by the steps of the method described previously.

According to another implementation variant of one or the other of the examples of methods for producing inter-level connection elements described previously, a sacrificial material 51 and a replacement of this sacrificial material is provided on certain localised regions of the stack situated between the levels $N_1$ and $N_2$ of the 3D stack of components. Localised regions of the stack intended to comprise a material sensitive to certain thermal treatments, for example such as copper, are here targeted.

Figure 6A:
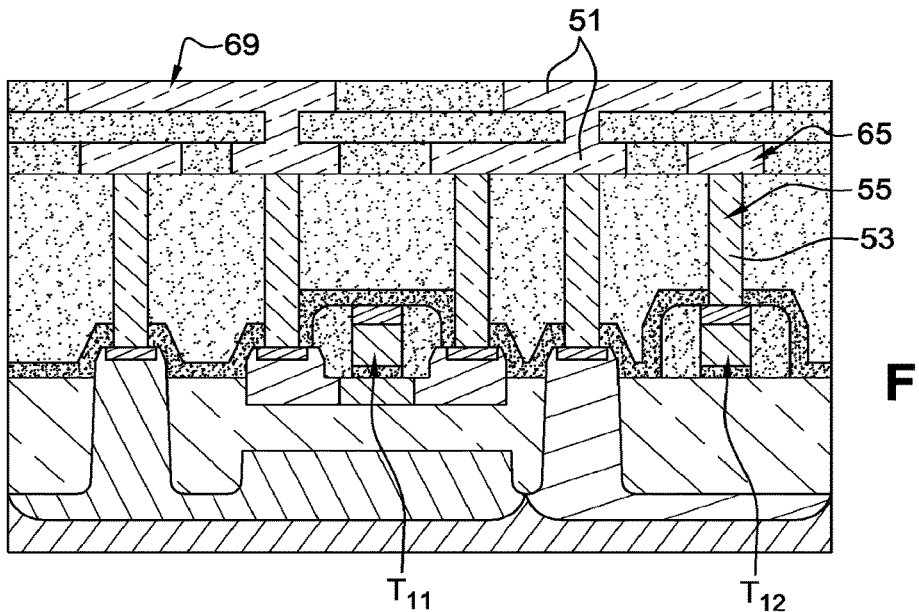
FIGS. 6A-6B illustrate an embodiment variant of the method in which the sacrificial elements are produced in localised regions intended to receive a conductor material sensitive to a considerable thermal budget, between two levels of transistors of the 3D circuit.
Figure 6B:
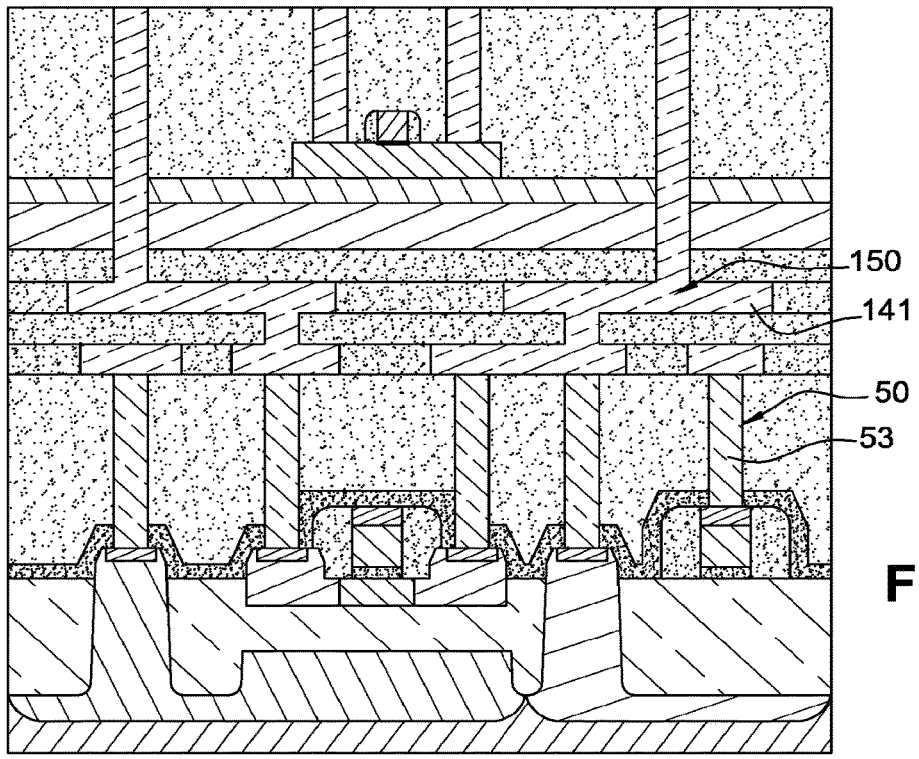

Thus, according to an example of embodiment of this variant illustrated in FIGS. 6A-6B, the first holes 41, 42, 43, 44, 48 may be directly filled with a metallic material 53 capable of resisting a considerable thermal budget such as for example tungsten. Contact plots 55 are then formed for the transistors $T_{11}$, $T_{12}$. Then, the elements 69 based on sacrificial material 51 are produced in at least one porous layer 60 (FIG. 6A).

This sacrificial material 51 is then replaced by a conductor material 141 such as copper, less resistant than the metallic material 53 to considerable thermal budgets (FIG. 6B). The replacement is carried out for example by means of a method such as described previously in conjunction with FIGS. 1G-1L.

Figure 7A:
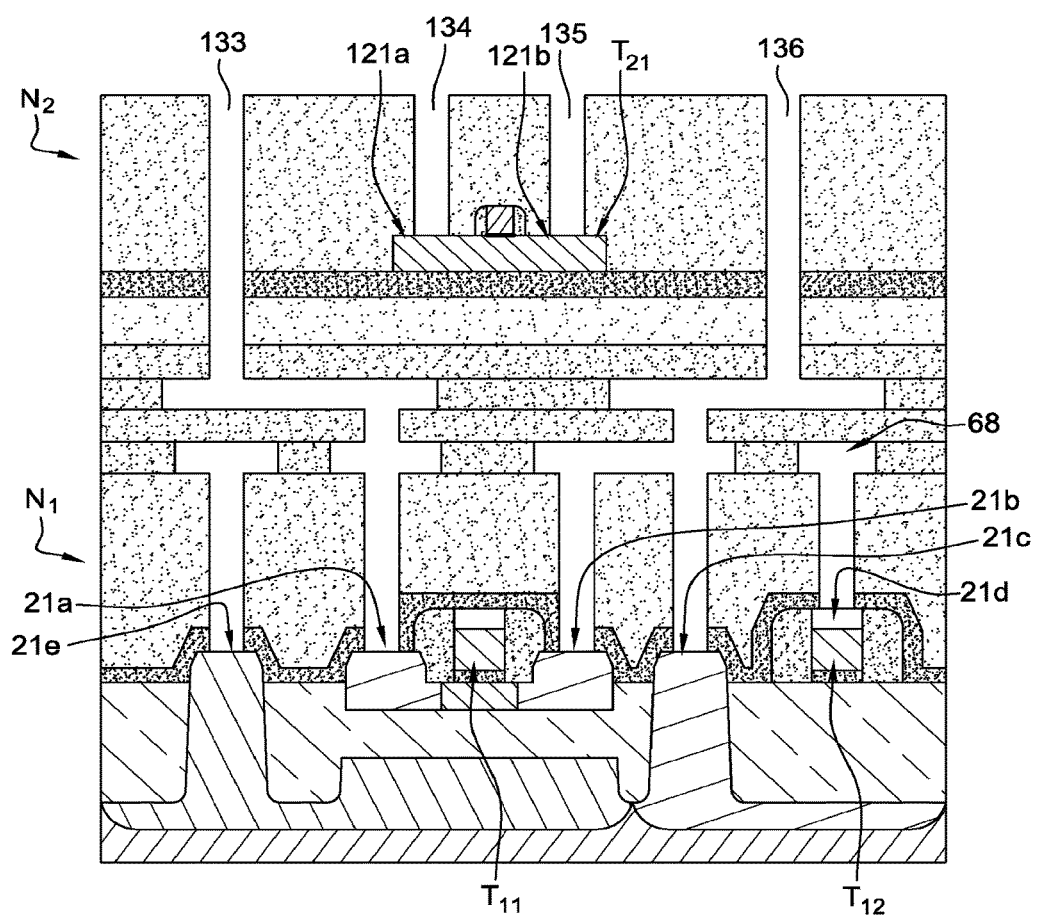
FIGS. 7A-7B illustrate an embodiment variant in which a silicidation of regions of transistors belonging to different levels is carried out at the same time.

Another embodiment variant (FIGS. 7A-7B) of one or the other of the examples of methods described previously provides for deferring the silicidation of regions of transistors $T_{11}$, $T_{12}$ of the first level $N_1$, and carrying out this step before carrying out a step of filling the openings 133, 134, 135, 136 as described previously in conjunction with FIG. 1L.

Figure 7B:
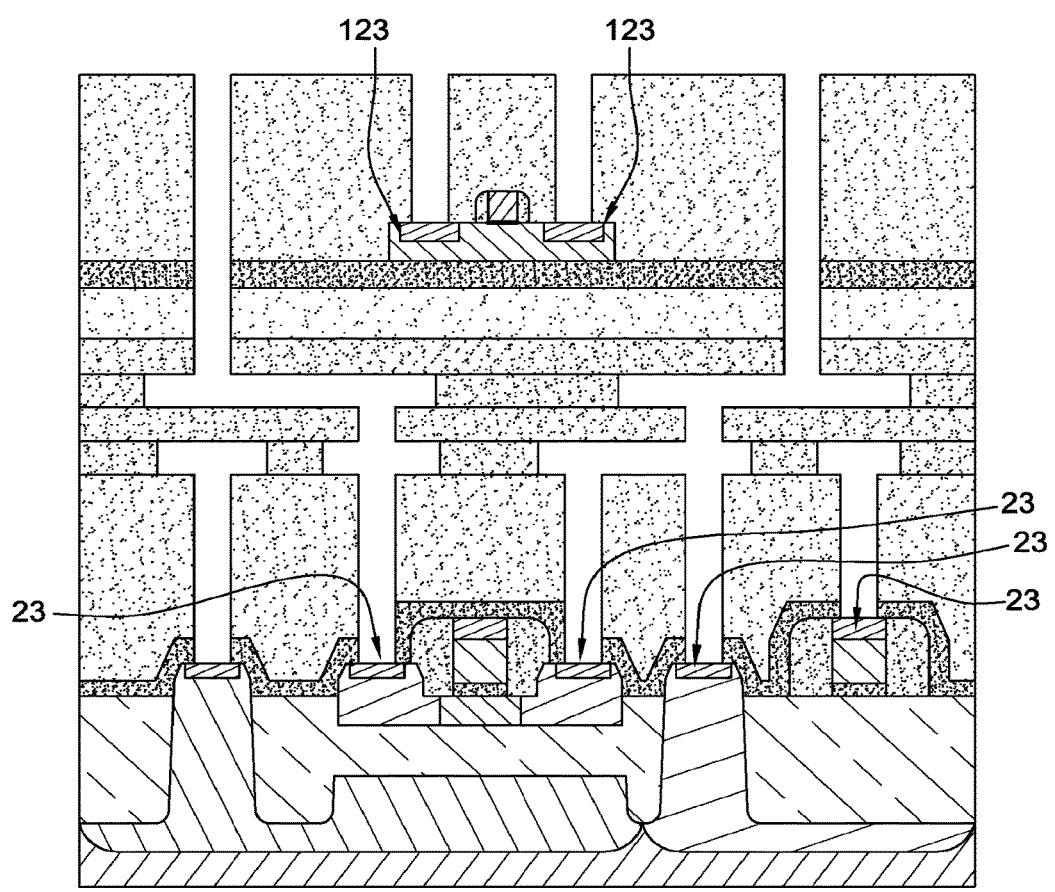

In this case, after having formed the openings 133, 134, 135, 136 (FIG. 7A) certain openings 133, 136 communicating with one or more openings 68 passing through the porous layer(s) 60 and emerging respectively on given regions 21a, 21b, 21c, 21d, 21e of the transistors $T_{11}$, $T_{12}$ of the first level $N_1$ are used to produce zones of alloy of metal and semi-conductor on these regions. The openings 134, 135 revealing regions 121a, 121b of the transistor $T_{21}$ of the second level $N_2$ are also used to produce zones of alloy of metal and semi-conductor. It is thus possible to produce at the same time zones of alloy of metal and semi-conductor 23, on regions of transistors $T_{11}$, $T_{12}$ of the first level $N_1$ and zones of alloy of metal and semi-conductor 123, on regions of the transistor $T_{21}$ of the second level $N_2$ (FIG. 7B). The zones of alloy may be formed by what is commonly known as "electroless" deposition of a metal such as for example Ni or an alloy. Such a method makes it possible to deposit metals at low cost on surfaces or inside complex structures. The metal not having reacted by chemical means may be potentially conserved. In a variant, the zones of alloy may be formed by means of a method such as described for example in the document FR 3002688.

The invention claimed is:

1. A method for producing one or more connection elements for an integrated circuit comprising:
   producing one or more sacrificial elements passing through at least one porous layer, the at least one porous layer surmounting a first transistor produced at least partially in a first semi-conductor layer, including forming one or more first openings passing through the at least one porous layer and filling the one or more first openings with a sacrificial material,
   forming a support on the at least one porous layer, the support including a second semi-conductor layer, wherein at least one second transistor is produced at least partially in the second semi-conductor layer,
   after producing the sacrificial elements, removing the one or more sacrificial elements using an etching agent of the sacrificial material introduced through the porous layer, and
   after forming the at least one second transistor, filling the one or more first openings by means of a conductor material so as to form connection elements using one or more second openings made in the support and emerging respectively on at least one of the first openings.

2. The method according to claim 1, wherein the removal of the one or more sacrificial elements is carried out before the step of forming the support.

3. The method according to claim 1, wherein after the forming of the support on the at least one porous layer and prior to the filling of the one or more first openings by the conductor material, performing at least one step of heat treatment at high temperature using a step of laser annealing or thermal annealing.

4. The method according to claim 1, further comprising, after formation of the one or more first openings and prior to the filling of the one or more first openings by means of a sacrificial material:
   depositing an encapsulation layer lining the bottom and the side walls of the one or more first openings, and
   removing the encapsulation layer at the bottom of the one or more first openings, the encapsulation layer remaining on the side walls of the one or more first openings.

5. The method according to claim 1, wherein the one or more first openings are formed by etching through a layer of hard mask, the layer of hard mask being conserved during the step of forming the support.

6. The method according to claim 1, further comprising, after filling the one or more first openings by means of the conductor material:
   making at least one access well in the support revealing the porous layer,
   removing the material of the at least one porous layer by etching through the access well, and
   replacing the material of the at least one porous layer by a dielectric material.

7. The method according to claim 1, wherein the conductor material comprises Cu, W or Co.

8. The method according to claim 6, wherein the conductor material is formed by electroless deposition.

9. The method according to claim 1, wherein the sacrificial material is a polymer material.

10. The method according to claim 9, wherein the etching agent comprises a gas or a plasma capable of reacting with the polymer material.

11. The method according to claim 1, wherein the at least one porous layer is formed on an insulator layer covering the first transistor, one or more connection pads pass through the insulator layer, and at least one of the first openings reveals at least one connection pad.

12. The method according to claim 1, wherein at least one of the one or more first openings reveals a region of the first transistor, the method further including, after removal of the sacrificial material and prior to the filling by means of a conductor material, forming a zone of alloy of metal and semi-conductor on the region of the first transistor.

13. The method according to claim 1, wherein forming the porous layer comprises:
   forming a layer of SiCN; and
   forming a layer of SiOC on the layer of SiCN.

14. The method according to claim 13, comprising:
   forming the layer of SiCN to a thickness of about 20 nm; and
   forming the layer of SiOC to a thickness of about 140 nm.

15. The method according to claim 1, further comprising, after filling the one or more first openings by means of the conductor material:
   making at least one access well in the support revealing the porous layer,
   removing the material of the at least one porous layer by etching through the access well, and
   replacing the material of the at least one porous layer by a dielectric material.

16. A method for producing one or more connection elements for an integrated circuit, comprising:
   producing one or more sacrificial elements passing through a first porous layer, the first porous layer formed on a first transistor produced at least partially in a first semi-conductor layer, including forming at least one first opening passing through the first porous layer and filling the at least one first opening with a sacrificial material,
   forming a second porous layer on the first porous layer and the one or more sacrificial elements such that the one or more sacrificial elements are completely surrounded by the first and second porous layers,
   removing the one or more sacrificial elements using an etching agent capable of being introduced through the first and second porous layers to produce at least one second opening,
   forming a second semi-conductor layer on the second porous layer, wherein at least one second transistor is formed at least partially in the second semi-conductor layer,
   forming at least one aperture through the second semi-conductor layer and the second porous layer to expose the at least one second opening, and
   filling the at least one second opening and the aperture with a conductor material so as to form connection elements.

17. The method according to claim 16, further comprising, after formation of the at least one first opening and prior to the filling of the at least one first opening by means of a sacrificial material:
   depositing an encapsulation layer lining the bottom and the side walls of the at least one first opening, and
   removing the encapsulation layer at the bottom of the at least one first opening, the encapsulation layer remaining on the side walls of the at least one first opening.

18. The method according to claim 16, wherein forming at least one of the first and second porous layers comprises:
   forming a layer of SiCN; and
   forming a layer of SiOC on the layer of SiCN.

19. The method according to claim 18, comprising:
   forming the layer of SiCN to a thickness of about 20 nm; and
   forming the layer of SiOC to a thickness of about 140 nm.

* * * * *